(12) United States Patent
Zhao

(10) Patent No.: US 10,461,137 B2
(45) Date of Patent: Oct. 29, 2019

(54) ORGANIC ELECTROLUMINESCENT DISPLAY PANEL AND METHOD FOR MANUFACTURING THE SAME

(71) Applicant: BOE Technology Group Co., Ltd., Beijing (CN)

(72) Inventor: Dejiang Zhao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/816,264

(22) Filed: Nov. 17, 2017

(65) Prior Publication Data

US 2018/0286934 A1 Oct. 4, 2018

(30) Foreign Application Priority Data

Mar. 29, 2017 (CN) .......................... 2017 1 0197847

(51) Int. Cl.
*H01L 27/32* (2006.01)
*H01L 51/00* (2006.01)
*H01L 51/56* (2006.01)

(52) U.S. Cl.
CPC ...... *H01L 27/3246* (2013.01); *H01L 51/0005* (2013.01); *H01L 51/56* (2013.01); *H01L 27/3218* (2013.01)

(58) Field of Classification Search
CPC .................. H01L 27/3218; H01L 27/3246
USPC ...................................................... 257/40, 59
See application file for complete search history.

(56) References Cited

U.S. PATENT DOCUMENTS

| 6,828,727 | B2 * | 12/2004 | Yamazaki | ........... H01L 27/3246 257/100 |
| 6,992,326 | B1 * | 1/2006 | MacPherson | ....... H01L 27/3246 257/40 |
| 2005/0112341 | A1 * | 5/2005 | Ito | ........................ H01L 27/3246 428/209 |

(Continued)

FOREIGN PATENT DOCUMENTS

| CN | 103715221 A | 4/2014 |
| CN | 105404038 A | 3/2016 |

OTHER PUBLICATIONS

Chinese Office Action for counterpart 201710197847.7 dated Mar. 29, 2019.

*Primary Examiner* — Lex H Malsawma
*Assistant Examiner* — Eric W Jones
(74) *Attorney, Agent, or Firm* — Arent Fox LLP; Michael Fainberg

(57) ABSTRACT

The disclosure provides an organic electroluminescent display panel, and a method for fabricating the same. The organic electroluminescent display panel includes a substrate, and a pixel defining layer and a light emitting layer arranged on the substrate, wherein the pixel defining layer includes a first pixel defining layer arranged on the substrate, and a second pixel defining layer arranged on the first pixel defining layer; the first pixel defining layer includes a plurality of first opening areas, each first opening area defines a sub-pixel light emitting area, and the light emitting layer is arranged in the first opening areas; and the second pixel defining layer includes a plurality of second opening areas, each second opening area defines a virtual pixel area, and each virtual pixel area includes at least two adjacent sub-pixel light emitting areas in the same color.

16 Claims, 5 Drawing Sheets

(56) References Cited

U.S. PATENT DOCUMENTS

| | | | | |
|---|---|---|---|---|
| 2005/0266763 A1* | 12/2005 | Kimura | ............... | H01L 51/0005 445/24 |
| 2010/0193791 A1* | 8/2010 | Chun | .................. | H01L 27/3246 257/59 |
| 2014/0091285 A1* | 4/2014 | Shin | .................... | H01L 51/5203 257/40 |
| 2014/0131743 A1* | 5/2014 | Jiang | .................. | H01L 27/3246 257/88 |
| 2014/0197385 A1* | 7/2014 | Madigan | ................. | H01L 51/56 257/40 |
| 2014/0197396 A1* | 7/2014 | Madigan | ............. | H01L 51/0005 257/40 |
| 2014/0233843 A1* | 8/2014 | Cocca | ................... | G06T 7/0004 382/145 |
| 2014/0354139 A1* | 12/2014 | Yoon | ...................... | H05B 33/12 313/498 |
| 2016/0118450 A1* | 4/2016 | Lee | ....................... | H01L 51/001 257/40 |

\* cited by examiner

ORGANIC ELECTROLUMINESCENT DISPLAY PANEL AND METHOD FOR MANUFACTURING THE SAME

CROSS-REFERENCE TO RELATED APPLICATION

This Application claims priority to Chinese Patent Application No. 201710197847.7, filed on Mar. 29, 2017, the content of which is incorporated by reference in the entirety.

TECHNICAL FIELD

The present disclosure relates to the field of display technologies, and particularly to an organic electroluminescent display panel, and method for manufacturing the same.

DESCRIPTION OF THE RELATED ART

An Organic Electroluminescent Display (OLED) panel has self-light-emission, a higher response speed, a wider angle of view, higher brightness, higher hue saturation, a lower weight, a smaller thickness, and other advantages as compared with a Liquid Crystal Display (LCD), so the OLED panel has been accepted as the next generation of display technology.

At present, a film in the OLED panel is generally formed by vapor depositing and inkjet printing. The vapor depositing technology for film formation has been matured in an application of an OLED panel with a small size, and currently there is a large-scale production using this technology; and the inkjet printing technology for film formation in which a film is formed rapidly, a material is fully utilized, and an OLED panel with a large size can be manufactured, is accepted as a significant approach to produce the OLED panel with a large size at a large scale. A light emitting layer is typically fabricated by fabricating a pixel defining layer on a substrate to define positions of respective sub-pixel light emitting areas, and thereafter fabricating the light emitting layer through inkjet printing in opening areas of the pixel defining layer, wherein each opening area corresponds to a sub-pixel light emitting area. However the specification of a jet head of an existing inkjet printing device is typically 10 pL or 35 pL so that the volume of an ink drop is limited, and the size of a formed sub-pixel is also limited. As a consequence, an OLED product with a high definition cannot be produced without modifying the existing inkjet printing device.

In view of this, how to improve the resolution of an OLED product without modifying the existing inkjet printing device is a technical problem highly desirable for those skilled in the art to address.

SUMMARY

Embodiments of the disclosure provide an organic electroluminescent display panel, and a method for fabricating the same.

In one aspect, an embodiment of the disclosure provides an organic electroluminescent display panel including a substrate, and a pixel defining layer and a light emitting layer arranged on the substrate, wherein the pixel defining layer includes a first pixel defining layer arranged on the substrate, and a second pixel defining layer arranged on the first pixel defining layer; the first pixel defining layer includes a plurality of first opening areas, each first opening area defines a sub-pixel light emitting area, and the light emitting layer is arranged in the first opening areas; and the second pixel defining layer includes a plurality of second opening areas, each second opening area defines a virtual pixel area, and each virtual pixel area includes at least two adjacent sub-pixel light emitting areas in a same color.

In another aspect, an embodiment of the disclosure further provides a method for manufacturing an organic electroluminescent display panel, the method including: forming a first pixel defining layer on a substrate, wherein the first pixel defining layer includes a plurality of first opening areas, each first opening area defines a sub-pixel light emitting area; forming a second pixel defining layer on the substrate formed with the first pixel defining layer, wherein the second pixel defining layer includes a plurality of second opening areas, each second opening area defines a virtual pixel area, and each virtual pixel area includes at least two adjacent sub-pixel light emitting areas in a same color; printing ink including a light emitting layer material in the second opening areas through an inkjet printing device; and drying the ink to form a light emitting layer in the first opening areas.

BRIEF DESCRIPTION OF THE DRAWINGS

In order to make the technical solutions according to the embodiments of the present disclosure more apparent, the drawings to which a description of the embodiments refers will be briefly introduced below, and apparently the drawings to be described below are merely illustrative of some of the embodiments of the present disclosure, and those ordinarily skilled in the art can derive from these drawings other drawings without any inventive effort.

DETAILED DESCRIPTION OF THE EMBODIMENTS

Figure 1:
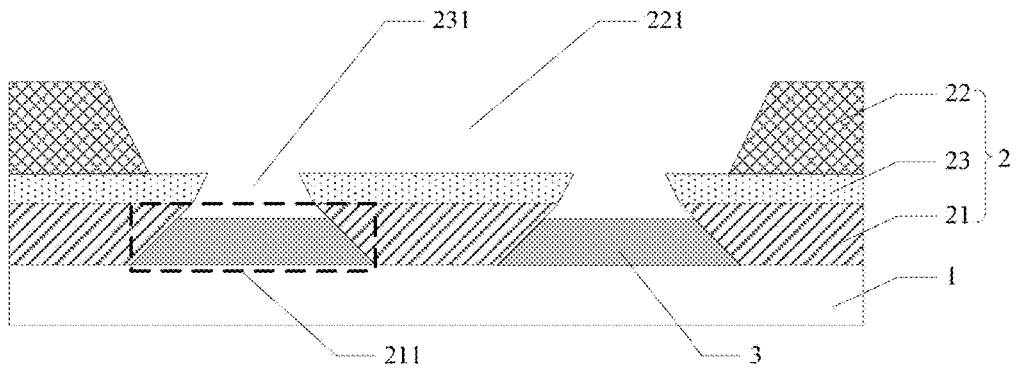
FIG. 1 is a schematic structural diagram of an organic electroluminescent display panel according to an embodiment of the disclosure.

Embodiments of the disclosure provide an organic electroluminescent display panel, and a method for fabricating the same so as to improve the resolution of an OLED product without modifying the existing inkjet printing device.

The technical solutions according to the embodiments of the disclosure will be described below clearly and fully with reference to the drawings in the embodiments of the disclosure, and apparently the embodiments described below are only a part but not all of the embodiments of the disclosure. Based upon the embodiments here of the disclosure, all the other embodiments which can occur to those ordinarily skilled in the art without any inventive effort shall fall into the scope of the disclosure.

It shall be noted that the thicknesses and shapes of respective layers in the drawings of the disclosure are not intended to reflect a real proportion, but only intended to illustrate the disclosure of the disclosure.

Referring to FIG. 1, an organic electroluminescent display panel according to an embodiment of the disclosure includes a substrate 1, and a pixel defining layer 2 and a light emitting layer 3 arranged on the substrate 1, where the pixel defining layer 2 includes a first pixel defining layer 21 arranged on the substrate 1, and a second pixel defining layer 22 arranged on the first pixel defining layer 21; the first pixel defining layer 21 includes a plurality of first opening areas 211 (as denoted in the dotted frame in FIG. 1), each first opening area 211 defines a sub-pixel light emitting area, and the light emitting layer 3 is arranged in the first opening areas 211; and the second pixel defining layer 22 includes a plurality of second opening areas 221, each second opening area 221 defines a virtual pixel area, and each virtual pixel area includes at least two adjacent sub-pixel light emitting areas in the same color. The first pixel defining layer 21 defines the light emitting areas of the respective sub-pixels, and the virtual pixel areas define ink deposition areas of the adjacent sub-pixels in the same color.

In some embodiments, the material of the first pixel defining layer 21 is a lyophilic material, and the material of the second pixel defining layer 22 is a lyophobic material, so that the lyophilic first pixel defining layer 21 can enable ink deposited in an inkjet printing process to be well spread in the sub-pixel light emitting areas to thereby form a uniform film layer, and the lyophobic second pixel defining layer 22 can avoid the printed material of the light emitting layer from easily remaining on the surface of the second pixel defining layer to thereby facilitate separation of the material of the light emitting layer from the second pixel defining layer.

Here the lyophilic material refers to such a material with an opposite polarity to that of another material that they absorb each other. If the ink is hydrous ink, then the material of the first pixel defining layer 21 may be a hydrophilic material, e.g., a silicon nitride (SiNx) material, and if the ink is oily ink, then the material of the first pixel defining layer 21 may be a lipophilic material.

Correspondingly the lyophobic material refers to such a material with the same polarity to that of another material that they repel each other. If the ink is hydrous ink, then the material of the second pixel defining layer 22 may be a hydrophobic material, e.g., an ultra-high molecular-weight polythene resin (AGC) material, and if the ink is oily ink, then the material of the second pixel defining layer 22 may be a lipophobic material.

The thickness of the first pixel defining layer 21 can be set according to the thickness of a light emitting device, and in some embodiments, the thickness of the first pixel defining layer 21 can be set from 400 nm to 600 nm.

The thickness of the second pixel defining layer 22 can be set according to the structure of the OLED device, and in some embodiments, the thickness of the second pixel defining layer 22 can be set from 800 nm to 2200 nm.

In some embodiments, in order to suppress the ink from climbing while the light emitting layer is being fabricated, as illustrated in FIG. 1, there is a third pixel defining layer 23 arranged between the first pixel defining layer 21 and the second pixel defining layer 22, where the third pixel defining layer 23 includes a plurality of third opening areas 231 corresponding to the first opening areas 211 in a one-to-one manner, each third opening area 231 is not larger than a corresponding first opening area 211, the material of the third pixel defining layer 23 is a lyophilic material, and the lyophilic performance of the material of the first pixel defining layer 21 is higher than that of the material of the third pixel defining layer 23. If the ink is hydrous ink, then the material of the third pixel defining layer 23 will be a hydrophilic material, e.g., the silicon oxide (SiO2) material. In some embodiments, the thickness of the third pixel defining layer 23 ranges from 100 nm to 200 nm.

Since the third opening area is arranged no larger than the corresponding first opening area, and the lyophilic performance of the material of the first pixel defining layer is higher than that of the material of the third pixel defining layer, the ink can be suppressed from climbing while the light emitting layer is being fabricated.

In some embodiments, in order to further suppress the ink from climbing while the light emitting layer is being fabricated, as illustrated in FIG. 1, there are sloped sidewalls of each first opening area 211 and each third opening area 231, where the sloped sidewalls are inclined at a sharp angle, that is, the sloped sidewalls are inclined outward. The opening areas shaped above can be formed by selecting appropriate etching parameters.

Figure 2:
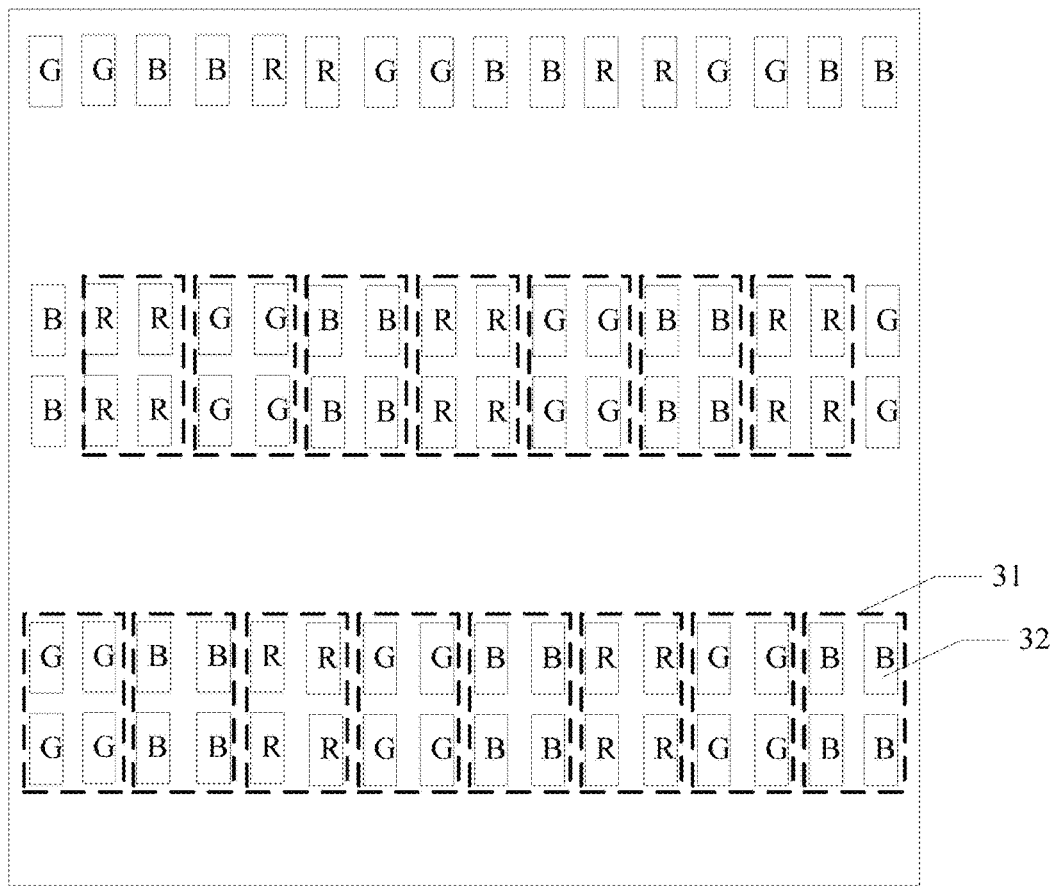
FIG. 2 is a schematic diagram of a first pixel structure in an organic electroluminescent display panel according to an embodiment of the disclosure.
Figure 3:
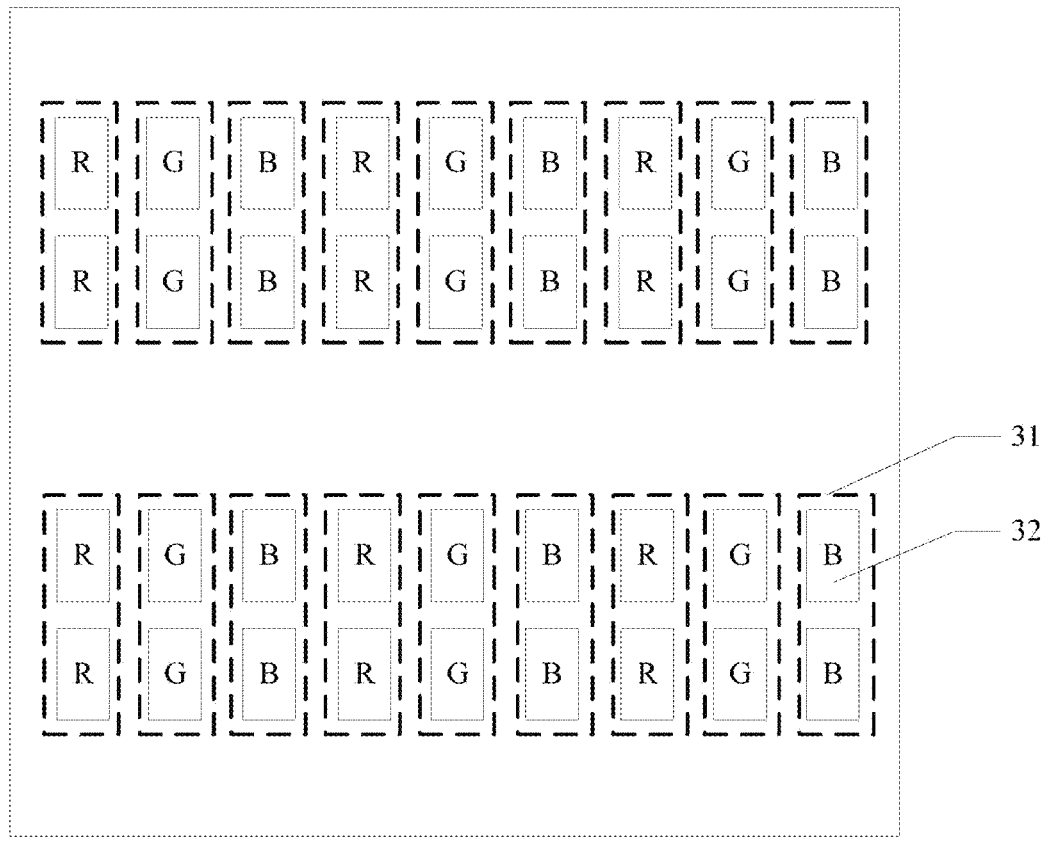
FIG. 3 is a schematic diagram of a second pixel structure in an organic electroluminescent display panel according to an embodiment of the disclosure.

In some embodiments, each virtual pixel area 31 (as denoted in the dotted frame in FIG. 2) includes four sub-pixel light emitting areas 32 in the same color, which are arranged in two rows by two columns, and FIG. 2 illustrates a schematic diagram of a pixel structure thereof. Each virtual pixel area 31 (as denoted in the dotted frame in FIG. 3) may alternatively include two sub-pixel light emitting areas 32 in the same color, and FIG. 3 illustrates a schematic diagram of a pixel structure thereof. Of course, the number of sub-pixel light emitting areas 32 in the same color in each virtual pixel area 31 may alternatively be another number, although the embodiment of the disclosure will not be limited thereto.

Figure 4:
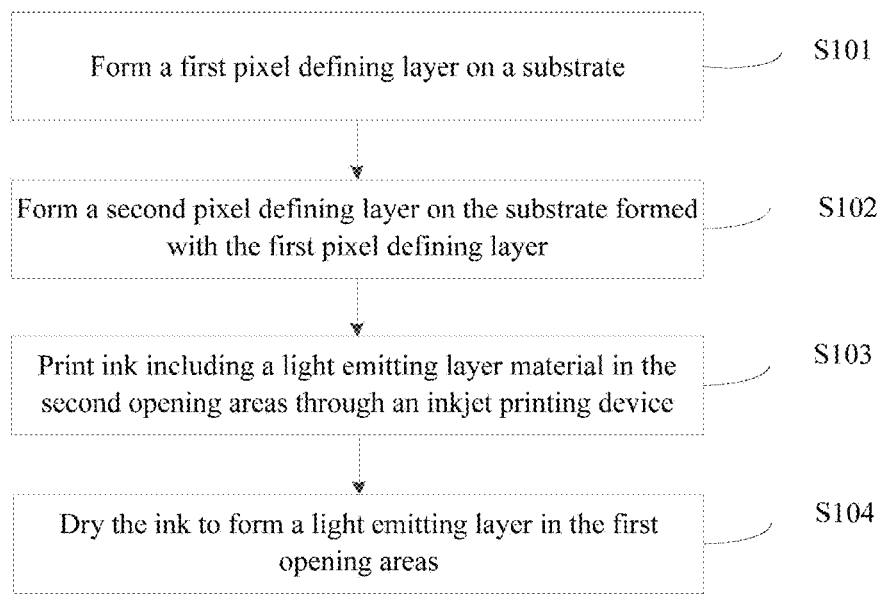
FIG. 4 is a schematic flow chart of a method for manufacturing an organic electroluminescent display panel according to an embodiment of the disclosure.

Based upon the same inventive idea, as illustrated in FIG. 4, an embodiment of the disclosure further provides a method for manufacturing an organic electroluminescent display panel, where the method includes the following operations.

The operation S101 is to form a first pixel defining layer on a substrate, where the first pixel defining layer includes a plurality of first opening areas, each first opening area defines a sub-pixel light emitting area.

The operation S102 is to form a second pixel defining layer on the substrate formed with the first pixel defining layer, where the second pixel defining layer includes a plurality of second opening areas, each second opening area defines a virtual pixel area, and each virtual pixel area includes at least two adjacent sub-pixel light emitting areas in the same color.

The operation S103 is to print ink including a light emitting layer material in the second opening areas through an inkjet printing device.

The operation S104 is to dry the ink to form a light emitting layer in the first opening areas.

In some embodiments, forming the first pixel defining layer on the substrate in the operation S101 includes: depositing a thin film of the first pixel defining layer on the substrate, where the material of the thin film of the first pixel defining layer is a lyophilic material; and patterning the thin film of the first pixel defining layer to form the first pixel defining layer.

In some embodiments, forming the second pixel defining layer on the substrate formed with the first pixel defining layer in the operation S102 includes: forming a thin film of the second pixel defining layer on the substrate formed with the first pixel defining layer, where the material of the thin film of the second pixel defining layer is a lyophobic material; and patterning the thin film of the second pixel defining layer to form the second pixel defining layer.

In some embodiments, after the thin film of the first pixel defining layer is deposited, and before the first pixel defining layer is formed, the method can further includes: depositing a thin film of a third pixel defining layer on the thin film of the first pixel defining layer, where the material of the thin film of the third pixel defining layer is a lyophilic material, and the lyophilic performance of the material of the thin film of the first pixel defining layer is higher than that of the material of the thin film of the third pixel defining layer.

Correspondingly, patterning the thin film of the first pixel defining layer to form the pixel defining layer includes: dry etching the thin film of the third pixel defining layer, and the thin film of the first pixel defining layer to form the third pixel defining layer and the first pixel defining layer respectively, where the third pixel defining layer includes a plurality of third opening areas corresponding to the first opening areas in a one-to-one manner, and the etch selectivity of the thin film of the first pixel defining layer to the thin film of the third pixel defining layer is more than 1 (for example, the etch selectivity of the thin film of the first pixel defining layer to the thin film of the third pixel defining layer is 5:1).

It shall be noted that third pixel defining layer and the first pixel defining layer are formed together in the method above, and since the etch selectivity of the thin film of the first pixel defining layer to the thin film of the third pixel defining layer is more than 1, a formed third opening area will not be larger than a corresponding formed first opening area.

A flow of a process for manufacturing an organic electroluminescent display panel according to an embodiment of the disclosure will be described below in details with reference to FIG. 5A to FIG. 5G by way of an example in which a virtual pixel area includes four sub-pixel light emitting areas in the same color, there are three pixel defining layers, and ink is hydrous ink.

Figure 5A:
FIG. 5A to FIG. 5G are schematic flow charts of a process for manufacturing an organic electroluminescent display panel according to an embodiment of the disclosure.

The first operation is to deposit a SiNx thin film 42 with the thickness of 400 nm on a substrate 41 as illustrated in FIG. 5A.

Figure 5B:
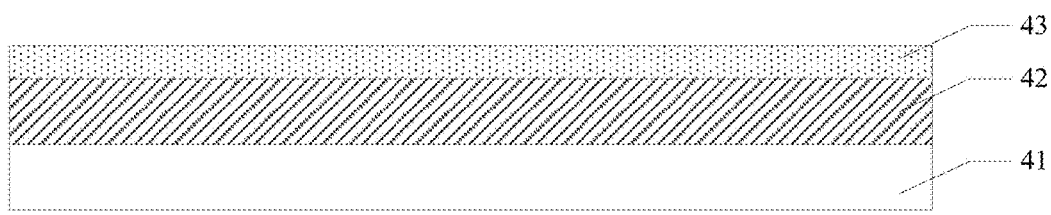

The second operation is to deposit a $SiO_2$ thin film 43 with the thickness of 100 nm on the SiNx thin film 42 as illustrated in FIG. 5B; here the lyophilic performance of the SiNx thin film 42 is higher than that of the $SiO_2$ thin film 43.

Figure 5C:
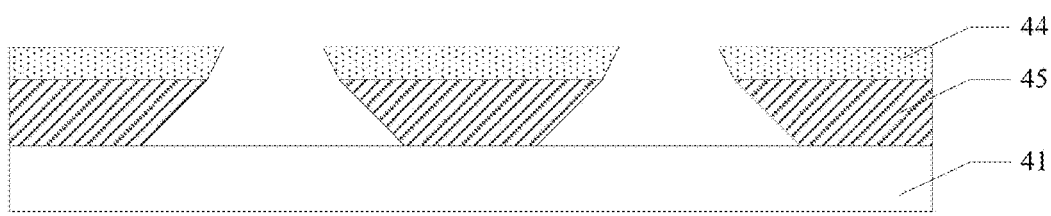

The third operation is to dry etch the $SiO_2$ thin film 43 and the SiNx thin film 42 to form a third pixel defining layer 44 and a first pixel defining layer 45 respectively as illustrated in FIG. 5C.

Here the first pixel defining layer 45 includes a plurality of first opening areas, each first opening area defines a sub-pixel light emitting area; and the third pixel defining layer 44 includes a plurality of third opening areas corresponding to the first opening areas in a one-to-one manner, and there are sloped sidewalls of each first opening area and each third opening area, where the sloped sidewalls are inclined at a sharp angle, that is, the sloped sidewalls are inclined outward. The etch selectivity of the SiNx thin film to the $SiO_2$ thin film is 5:1, and since the etch selectivity of the SiNx thin film is more than 1, a formed third opening area will not be larger than a corresponding formed first opening area.

Figure 5D:
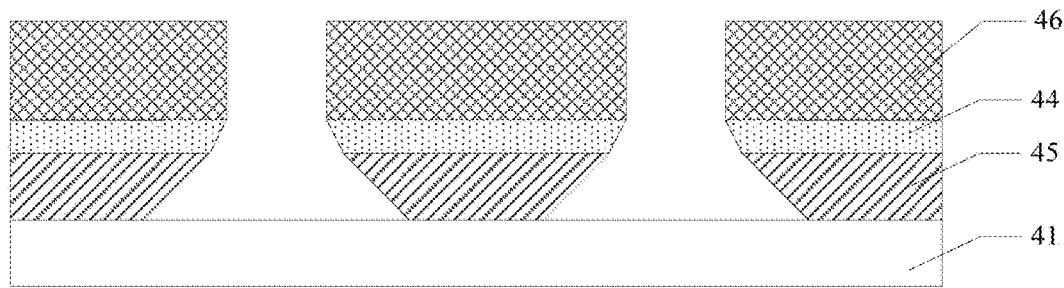

The fourth operation is to form an AGC thin film 46 with the thickness of 1500 nm on the substrate 41 formed with the first pixel defining layer 45 and the third pixel defining layer 44 as illustrated in FIG. 5D.

Figure 5E:
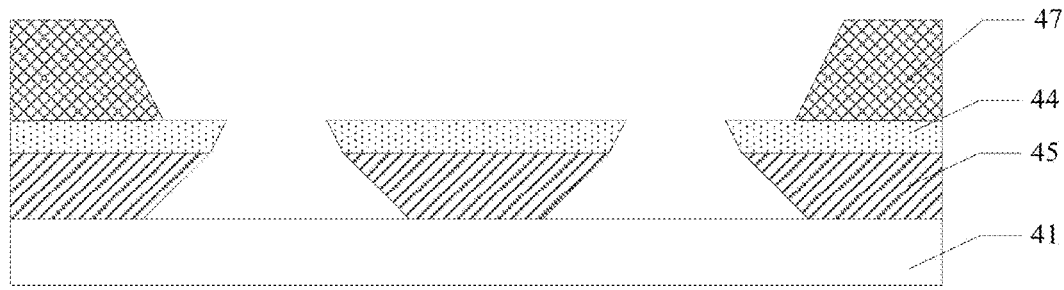

The fifth operation is to pattern the AGC thin film 46 to form a second pixel defining layer 47 as illustrated in FIG. 5E, for example, to expose, develop, etc., the AGC thin film 46 to form the second pixel defining layer 47.

Here the second pixel defining layer 47 includes a plurality of second opening areas, each second opening area defines a virtual pixel area, and each virtual pixel area includes four adjacent sub-pixel light emitting areas in the same color, where the four adjacent sub-pixel light emitting areas in the same color arranged in two rows by two columns, and FIG. 2 illustrates a schematic diagram of a pixel structure thereof.

Figure 5F:
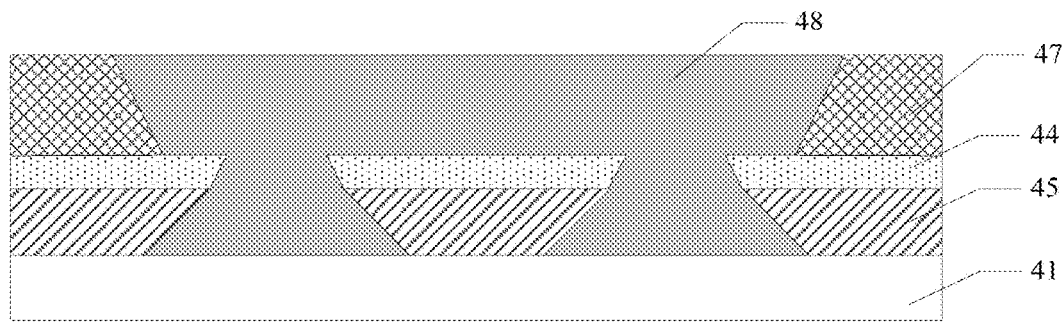

The sixth operation is to print ink 48 including a light emitting layer material in the second opening areas through an inkjet printing device as illustrated in FIG. 5F.

Figure 5G:
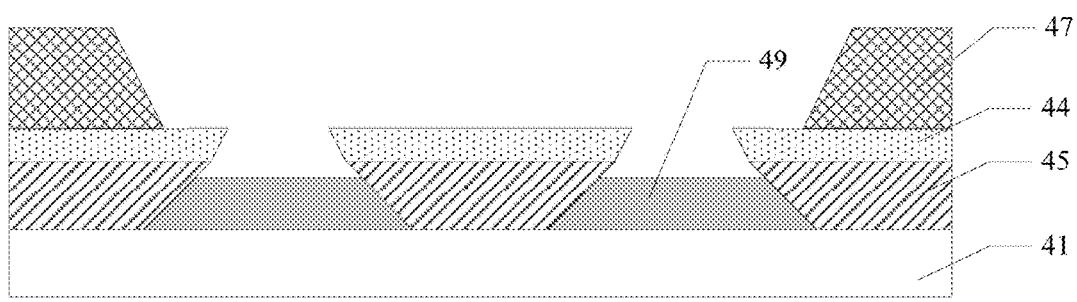

The seventh operation is to dry the ink 48 to form a light emitting layer 49 in the first opening areas as illustrated in FIG. 5G In summary, in the technical solution according to the embodiments of the disclosure, the light emitting layer can be fabricated by printing the ink in the second opening areas (i.e., the virtual pixel areas) through the inkjet printing device, and thereafter drying the ink to form the light emitting layer in the first opening areas (i.e., the sub-pixel light emitting areas) of the first pixel defining layer, where each virtual pixel area includes at least two adjacent sub-pixel light emitting areas in the same color, and given the specification of the jet head, a larger number of sub-pixels with a less size can be formed as compared with the related art in which the ink is printed in the sub-pixel light emitting areas to form the light emitting layer, so the resolution of the OLED product can be improved without modifying the existing inkjet printing device.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. An organic electroluminescent display panel, comprising a substrate, and a pixel defining layer and a light emitting layer on the substrate, wherein:
    the pixel defining layer comprises a first pixel defining layer on the substrate, a second pixel defining layer on the first pixel defining layer, and a third pixel defining layer between the first pixel defining layer and the second pixel defining layer;
    the first pixel defining layer comprises a plurality of first opening areas, each of which defines a sub-pixel light emitting area, and the light emitting layer is arranged in the plurality of first opening areas;
    the second pixel defining layer comprises a plurality of second opening areas, each of which defines a virtual pixel area comprising at least two adjacent sub-pixel light emitting areas in a same color; and
    the third pixel defining layer comprises a plurality of third opening areas corresponding to the plurality of first opening areas in a one-to-one manner, and each of the plurality of third opening areas is not larger than a corresponding first opening area;
    wherein respective virtual pixel areas defined by the plurality of second opening areas comprise a same number of sub-pixel light emitting areas; and virtual pixel areas containing red sub-pixel light emitting areas, virtual pixel areas containing green sub-pixel light emitting areas, and virtual pixel areas containing blue sub-pixel light emitting areas are disposed alternately in each row of the respective virtual pixel areas; and wherein sidewalls of respective first opening areas, respective second opening areas, and respective third opening areas are sloped, top areas of the respective first opening areas and the respective third opening areas are smaller than their corresponding bottom areas, and top areas of the respective second opening areas are greater than their corresponding bottom areas.

2. The organic electroluminescent display panel according to claim 1, wherein a material of the first pixel defining layer is a lyophilic material and a material of the second pixel defining layer is a lyophobic material.

3. The organic electroluminescent display panel according to claim 2, wherein a material of the third pixel defining layer is a lyophilic material, wherein a lyophilic performance of the material of the first pixel defining layer is higher than that of the material of the third pixel defining layer.

4. The organic electroluminescent display panel according to claim 1, wherein a thickness of the first pixel defining layer ranges from 400 nm to 600 nm.

5. The organic electroluminescent display panel according to claim 4, wherein a material of the third pixel defining layer is a lyophilic material, wherein a lyophilic performance of the material of the first pixel defining layer is higher than that of the material of the third pixel defining layer.

6. The organic electroluminescent display panel according to claim 1, wherein a thickness of the second pixel defining layer ranges from 800 nm to 2200 nm.

7. The organic electroluminescent display panel according to claim 6, wherein a material of the third pixel defining layer is a lyophilic material, wherein a lyophilic performance of the material of the first pixel defining layer is higher than that of the material of the third pixel defining layer.

8. The organic electroluminescent display panel according to claim 1, wherein a thickness of the third pixel defining layer ranges from 100 nm to 200 nm.

9. The organic electroluminescent display panel according to claim 1, wherein each virtual pixel area comprises four sub-pixel light emitting areas in a same color, which are arranged in two rows by two columns.

10. A method for manufacturing an organic electroluminescent display panel, the method comprising:
forming a first pixel defining layer and a third pixel defining layer on a substrate, wherein the first pixel defining layer comprises a plurality of first opening areas, each of which defines a sub-pixel light emitting area; the third pixel defining layer comprises a plurality of third opening areas corresponding to the plurality of first opening areas in a one-to-one manner, and each of the plurality of third opening areas is not larger than a corresponding first opening area;
forming a second pixel defining layer on the substrate formed with the first pixel defining layer and the third pixel defining layer, wherein the second pixel defining layer comprises a plurality of second opening areas, each of which defines a virtual pixel area comprising at least two adjacent sub-pixel light emitting areas in a same color;

printing ink comprising a light emitting layer material in the plurality of second opening areas through an inkjet printing device; and
drying the ink to form a light emitting layer in the plurality of first opening areas;
wherein respective virtual pixel areas defined by the plurality of second opening areas comprise a same number of sub-pixel light emitting areas; and virtual pixel areas containing red sub-pixel light emitting areas, virtual pixel areas containing green sub-pixel light emitting areas, and virtual pixel areas containing blue sub-pixel light emitting areas are disposed alternately in each row of the respective virtual pixel areas; and
wherein sidewalls of respective first opening areas, respective second opening areas, and respective third opening areas are sloped, top areas of the respective first opening areas and the respective third opening areas are smaller than their corresponding bottom areas, and top areas of the respective second opening areas are greater than their corresponding bottom areas.

11. The method according to claim 10, wherein the forming the first pixel defining layer and the third pixel defining layer on the substrate comprises:
depositing a thin film of the first pixel defining layer on the substrate, wherein a material of the thin film of the first pixel defining layer is a lyophilic material;
depositing a thin film of the third pixel defining layer on the thin film of the first pixel defining layer, wherein a material of the thin film of the third pixel defining layer is a lyophilic material, and a lyophilic performance of the material of the thin film of the first pixel defining layer is higher than that of the material of the thin film of the third pixel defining layer; and
dry etching the thin film of the third pixel defining layer, and the thin film of the first pixel defining layer to form the third pixel defining layer and the first pixel defining layer respectively, wherein an etch selectivity of the thin film of the first pixel defining layer to the thin film of the third pixel defining layer is more than 1.

12. The method according to claim 11, wherein the forming the second pixel defining layer on the substrate formed with the first pixel defining layer and the third pixel defining layer comprises:
forming a thin film of the second pixel defining layer on the substrate formed with the first pixel defining layer and the third pixel defining layer, wherein a material of the thin film of the second pixel defining layer is a lyophobic material; and
patterning the thin film of the second pixel defining layer to form the second pixel defining layer.

13. The method according to claim 10, wherein a thickness of the first pixel defining layer ranges from 400 nm to 600 nm.

14. The method according to claim 10, wherein a thickness of the second pixel defining layer ranges from 800 nm to 2200 nm.

15. The method according to claim 10, wherein each virtual pixel area comprises four sub-pixel light emitting areas in a same color, which are arranged in two rows by two columns.

16. The method according to claim 10, wherein a thickness of the third pixel defining layer ranges from 100 nm to 200 nm.

* * * * *